US007898307B2

(12) United States Patent
Marton et al.

(10) Patent No.: US 7,898,307 B2
(45) Date of Patent: Mar. 1, 2011

(54) PHASE DETECTOR CIRCUITRY

(75) Inventors: Walter Marton, Frankfurt (DE); Robert Braun, Bensheim (DE)

(73) Assignee: Fujitsu Semiconductor Limited, Kanagawa (JP)

(*) Notice: Subject to any disclaimer, the term of this patent is extended or adjusted under 35 U.S.C. 154(b) by 52 days.

(21) Appl. No.: 12/346,269

(22) Filed: Dec. 30, 2008

(65) Prior Publication Data

US 2010/0123482 A1 May 20, 2010

(30) Foreign Application Priority Data

Nov. 14, 2008 (EP) .................... 08169190

(51) Int. Cl.
*H03L 7/06* (2006.01)
(52) U.S. Cl. .............. 327/156; 327/3; 327/7; 327/105; 327/163; 331/18; 331/25
(58) Field of Classification Search ............. 327/2, 327/3, 5, 7–10, 12, 105, 147, 156, 162, 163; 331/1 R, 1 A, 18, 25
See application file for complete search history.

(56) References Cited

U.S. PATENT DOCUMENTS

| 5,982,840 | A | 11/1999 | Aisaka |
| 6,404,291 | B1 * | 6/2002 | Riley ............... 331/11 |
| 6,603,360 | B2 * | 8/2003 | Kim et al. ............ 331/1 A |
| 6,642,747 | B1 | 11/2003 | Chiu |
| 6,956,440 | B2 * | 10/2005 | Choi ............... 331/1 A |
| 6,987,406 | B1 | 1/2006 | Chiu |
| 7,639,053 | B2 * | 12/2009 | Shen et al. ............ 327/158 |
| 2002/0163389 | A1 | 11/2002 | Jun |

FOREIGN PATENT DOCUMENTS

EP 948138 A1 * 10/1999

(Continued)

OTHER PUBLICATIONS

IEEE Standard for Local and metropolitan area networks; Part 16: Air Interface for Fixed and Mobile Broadband Wireless Access Systems; IEEE Std. 802. 16e; Sponsored by the LAN/MAN Standards Committee, Feb. 28, 2006.

(Continued)

*Primary Examiner*—Lincoln Donovan
*Assistant Examiner*—Patrick O'Neill
(74) *Attorney, Agent, or Firm*—Arent Fox LLP

(57) ABSTRACT

A phase-locked loop frequency synthesizer including phase detector circuitry and divider circuitry producing a divided signal. The phase detector circuitry receives a reference signal, a divided signal fed back from the divider circuitry, and generates control pulses which control a charge pump in accordance with a frequency and phase relationship between the reference signal and the divided signal. The divider circuitry has a main divider which divides an input signal by a division ratio selected from a pair of dual modules division ratios, and outputs the divided input signal as an output signal and an auxiliary divider which produces serial output data, each bit of which serves as a dual modules selection signal to cause the main divider to operate using one of the pair of dual modules main division ratios. The auxiliary divider produces the divided signal once per cycle and outputs the pulse to the phase detector circuitry.

11 Claims, 10 Drawing Sheets

Block level diagram of the digital control unit and connectivity to other blocks

FOREIGN PATENT DOCUMENTS

WO      WO 01/50610 A1      7/2001

OTHER PUBLICATIONS

Terrence P. Kenny, et al.: "Design and Realization of a Digital Modulator for Fractional-Frequency Synthesis" IEEE Transactions On Vehicular Technology, IEEE Service Center, Piscataway, NJ, US, vol. 48, No. 2, Mar. 1, 1999 (XP011063829ISSN: 0018-9545).

Hongyu Wang, et al.: "A Genetic Multi-Modulus Divider Architecture For Fractional-N. Frequency Synthesisers" Frequency Control Symposium, 2007 Joint With The 21$^{st}$ European Frequency And Time Forum. IEEE International, IEEE, PI, May 1, 2007, pp. 261-265 (XP0311379661SBN: 978-1-4244-0646-3).

* cited by examiner

Legend
CP: Charge pump
IDiv: Integer divider
LF: Loop filter
MDiv: Main divider
PD: Phase detector
RDiv: Reference divider
SPI: Serial peripheral interface
VCO: Voltage controlled oscillator
XTAL: Crystal oscillator Simplified functional block diagram of the PLL synthesizer FIG. 2 Block diagram of the PLL synthesizer (external parts are in grey area)

Frequency calibration sequence (VCO output frequency over time)

Output frequency during recalibration (shortened sequence) and final analog locking Three possible phase detector time slots derived from IDiv setting 13

Block level diagram of the digital control unit and connectivity to other blocks

PHASE DETECTOR CIRCUITRY

The present invention relates to phase detector circuitry. In particular, but not exclusively, the present invention relates to phase detector circuitry for a phase-locked loop frequency synthesizer for use in communication systems, for example in wireless communication systems.

BACKGROUND

Typically, modern communication systems require the generation of a stable carrier signal, for example having a desired and stable carrier frequency. Such communication systems typically employ synthesizers and the like to generate such carrier signals. Control circuitry embodying the present invention may, for example, be used to generate such carrier signals and may form part or all of such synthesizers.

The performance of today's front-end architectures for wireless communication depends to an increasing degree on the performance of the employed synthesizers. This is because new wireless communication standards that aim for high data efficiency, like IEEE 802.16e (Mobile WiMAX), set tight requirements on the clarity and agility of the carrier generation. At the same time, the increased market pressure for highly integrated solutions with growing digital complexity is moving the target technologies for such front-ends below 100 nm, which adds additional limitations to the analogue design approach for synthesizer integration. As a result, it is a challenging task to implement competitive high-performance analogue blocks in a technology optimized for high-density digital design.

Typical demands in current synthesizer design are as follows. Firstly, a large voltage controlled oscillator (VCO) range (e.g. 487 MHz) is typically desired at a frequency (e.g. 3 GHz) where parasitic effects significantly reduce the usable control range. Secondly, a 1.2-V power supply voltage (for example) is often desired, which limits the usable VCO control range to e.g. 300 mV (when considering saturation margins), which is in conflict with the requirement for low VCO gain and extended frequency control range, Thirdly, there is the desire for low power consumption, which leads to higher power-related impedances (such as VCO tank impedance and loop filter impedance), but which conflicts with the requirement for lower impedance to give low noise (e.g. −95 dBc@ 100-kHz offset).

SUMMARY

According to a first aspect, there is provided phase detector circuitry for a phase-locked loop frequency synthesizer, the phase detector circuitry comprising a reference input configured to receive a reference signal;

a feedback input configured to receive a divided signal from divider circuitry in a feedback path of the phase-locked loop; and pulse generation circuitry configured to generate control pulses for controlling a charge pump in the phase-locked loop in accordance with a frequency and phase relationship between the reference signal and the divided signal;

wherein the divided signal comprises a pulse having a length shorter than a half period of the divided signal, and wherein the pulse generation circuitry is configured to generate the control pulses by masking the reference signal using the pulse of the divided signal as a mask, so as to define the edges of the control pulses from the edges of the divided signal and an edge of the reference signal.

In this way, the pulse generation circuitry may be configured to generate control pulses the sum of the lengths of which is smaller than a half period of the divided signal.

The pulse generation circuitry may be configured to split the pulse of the divided signal into an up pulse and a down pulse.

The pulse generation circuitry may be configured to generate control pulses having a control pulse length, defining the sum of the lengths of up and down control pulses, the control pulse length being split by an edge of the reference signal.

The pulse generation circuitry may be configured to generate one of an up pulse and a down pulse from one half of a pulse of the divided signal, and to generate the other of the up pulse and the down pulse from the other half of the pulse of the divided signal.

The pulse generation circuitry may comprise logic circuitry configured to receive the divided signal and the reference signal as inputs and to generate the control pulses as an output.

The logic circuitry may comprise a first AND gate which receives the reference signal and the divided signal from the divider circuitry and produces an up pulse as an output signal, and may further comprise a second AND gate which receives the divided signal and an inverted version of the reference signal and produces a down pulse as an output signal.

The phase detector circuitry may form part of a phase-locked loop frequency synthesizer which comprises the divider circuitry configured to produce the divided signal which comprises the pulse. The divider circuitry is thus configured to generate a divided signal which comprises a pulse having a length shorter than a half period of the divided signal. The divider circuitry may be configured to generate the pulse using a programmable divider, the pulse being generated once per cycle of the programmable divider, and the divider circuitry may further comprise a prescaler (which may be a dual modulus prescaler) configured to divide an output signal of a VCO and pass the signal so divided to the programmable divider.

According to a second aspect, there is provided a phase-locked loop frequency synthesizer comprising the phase detector circuitry of the first aspect, and further comprising the divider circuitry configured to generate the divided signal which comprises the pulse having a length shorter than a half period of the divided signal.

The divider circuitry may comprise a main divider configured to divide an input signal received from a feedback path of the phase-locked loop frequency synthesizer by a division ratio selected from a pair of dual modulus division ratios in accordance with a dual modulus selection signal, and to output the divided input signal as an output signal, the main divider comprising a control input for receiving the dual modulus selection signal; and an auxiliary divider comprising a shift register clocked by the output signal of the main divider, the shift register comprising a parallel input configured to receive parallel input data in the form of a fraction selection signal at the start of a cycle, and a serial output connected to the control input of the main divider, the auxiliary divider being configured to produce serial output data, each bit of which serves as a said dual modulus selection signal to cause the main divider to operate using one or the other of the pair of dual modulus main division ratios;

the auxiliary divider being configured to produce the divided signal which comprises the pulse once per cycle and to output the pulse to the phase detector circuitry.

According to a third aspect, there is provided a method of operating a phase detector circuitry for a phase-locked loop frequency synthesizer, the method comprising
receiving a reference signal;
receiving a divided signal from divider circuitry in a feedback path of the phase-locked loop; and
generating control pulses for controlling a charge pump in the phase-locked loop in accordance with a frequency and phase relationship between the reference signal and the divided signal;
wherein the divided signal which comprises a pulse having a length shorter than a half period of the divided signal, and wherein the method comprises generating the control pulses by masking the reference signal using the pulse of the divided signal as a mask, so as to define the edges of the control pulses from the edges of the divided signal and an edge of the reference signal.

The method may comprise using logic circuitry to receive the divided signal and the reference signal as inputs and to generate the control pulses as an output.

The method may comprise using a first AND gate to receive the reference signal and the divided signal from the divider circuitry and to produce an up pulse as an output signal, and further comprising using a second AND gate to receive the divided signal and an inverted version of the reference signal and to produce a down pulse as an output signal.

The method may comprise generating control pulses the sum of the lengths of which is smaller than a half period of the divided signal.

The method may comprise splitting the pulse of the divided signal into an up pulse and a down pulse.

The method may comprise generating control pulses having a control pulse length, defining the sum of the lengths of up and down control pulses, the control pulse length being split by an edge of the reference signal.

The method may comprise generating one of an up pulse and a down pulse from one half of a pulse of the divided signal, and to generate the other of the up pulse and the down pulse from the other half of the pulse of the divided signal.

According to a fourth aspect, there is provided a method of operating a phase-locked loop frequency synthesizer, the method comprising the method of the third aspect, and further comprising using divider circuitry to generate the divided signal which comprises the pulse having a length shorter than a half period of the divided signal.

The method may comprise
using a main divider to divide an input signal received from a feedback path of the phase-locked loop frequency synthesizer by a division ratio selected from a pair of dual modulus division ratios in accordance with a dual modulus selection signal, and to output the divided input signal as an output signal; and
using an auxiliary divider comprising a shift register clocked by the output signal of the main divider, the shift register comprising a parallel input configured to receive parallel input data in the form of a fraction selection signal at the start of a cycle, and a serial output connected to the control input of the main divider, the auxiliary divider being used to produce serial output data, each bit of which serves as a said dual modulus selection signal to cause the main divider to operate using one or the other of the pair of dual modulus main division ratios;
using the auxiliary divider to produce the divided signal which comprises the pulse once per cycle and to output the pulse to the phase detector circuitry.

According to a fifth aspect, there is provided divider circuitry for a phase-locked loop frequency synthesizer, the divider circuitry comprising
a main divider configured to divide an input signal received from a feedback path of the phase-locked loop frequency synthesizer by a division ratio selected from a pair of dual modulus division ratios in accordance with a dual modulus selection signal; and
an auxiliary divider comprising a shift register clocked by an output signal of the main divider, the shift register comprising a parallel input configured to receive parallel input data in the form of a fraction selection signal at the start of a cycle, and a serial output connected to a control input of the main divider, the auxiliary divider being configured to produce serial output data, each bit of which serves as a said dual modulus selection signal to cause the main divider to operate using one or the other of the pair of dual modulus main division ratios;
the auxiliary divider being configured to produce a pulse once per cycle of the shift register and to output the pulse to a phase detector of the phase-locked loop frequency synthesizer.

The divider circuitry may comprise control circuitry configured to output the fraction selection signal to the shift register in accordance with a desired total division ratio for the divider circuitry.

The auxiliary divider may comprise a programmable divider configured to divide the output signal of the main divider to generate a divided signal comprising the pulse.

The control circuitry may be configured to control the operational length of the shift register. The auxiliary divider may comprise the programmable divider configured to output a load signal to the shift register so as to control the operation length of the shift register. The load signal may comprise the pulse included in the divided signal produced once per cycle by the programmable divider. The control circuitry may control the division ratio of the programmable divider so as to set the operational length of the shift register.

The control circuitry may be configured to select a subset of the total number of bits in the shift register for use, to control the shift register to operate using only the selected subset of bits, and further to output the fraction selection signal only to the selected subset of bits, so as to control the operational length of the shift register.

The control circuitry may be configured to determine the operational length of the shift register (the division ratio of the programmable divider) in accordance with the desired total division ratio.

The control circuitry may comprise a pseudorandom generator configured to generate a pseudorandom number based on a fractional part of the desired total division ratio, and to output the fraction selection signal comprising the pseudorandom number to the shift register.

The pseudorandom number may comprise a number of bits which is fewer than the operational length of the shift register, wherein the control circuitry is configured to output a further number to the remaining bits of the shift register as part of the fraction selection signal.

The main divider may be configured to operate using a selected one of a plurality of pairs of dual modulus division ratios, the divider circuitry further comprising control circuitry configured to select a said pair of dual modulus division ratios in accordance with a desired total division ratio for the divider circuitry.

The control circuitry may be configured to select the said pair of dual modulus division ratios, the operational length of the shift register and the fraction selection signal in accordance with the desired total division ratio.

According to a sixth aspect, there is provided a method of operating divider circuitry for a phase-locked loop frequency synthesizer, the method comprising using a main divider configured to divide an input signal received from a feedback path of the phase-locked loop frequency synthesizer by a division ratio selected from a pair of dual modulus division ratios in accordance with a dual modulus selection signal; and using an auxiliary divider comprising a shift register clocked by an output signal of the main divider, the shift register comprising a parallel input configured to receive parallel input data in the form of a fraction selection signal at the start of a cycle, and a serial output connected to a control input of the main divider, the auxiliary divider being configured to produce serial output data, each bit of which serves as a said dual modulus selection signal to cause the main divider to operate using one or the other of the pair of dual modulus main division ratios;

using the auxiliary divider to produce a pulse once per cycle of the shift register and to output the pulse to a phase detector of the phase-locked loop frequency synthesizer.

The method may comprise outputting the fraction selection signal to the shift register in accordance with a desired total division ratio for the divider circuitry.

The method may comprise using a programmable divider to divide the output signal of the main divider to generate a divided signal comprising the pulse.

The method may comprise controlling the operational length of the shift register. The method may comprise using the programmable divider to output a load signal to the shift register so as to control the operation length of the shift register. The load signal may comprise the pulse included in the divided signal produced once per cycle by the programmable divider. The method may comprise controlling the division ratio of the programmable divider so as to set the operational length of the shift register.

The method may comprise selecting a subset of the total number of bits in the shift register for use, to control the shift register to operate using only the selected subset of bits, and outputting the fraction selection signal only to the selected subset of bits, so as to control the operational length of the shift register.

The method may comprise determining the operational length of the shift register (the division ratio of the programmable divider) in accordance with the desired total division ratio.

The method may comprise generating a pseudorandom number based on a fractional part of the desired total division ratio, and outputting the fraction selection signal comprising the pseudorandom number to the shift register.

The pseudorandom number may comprise a number of bits which is fewer than the operational length of the shift register, and the method may comprise determining and outputting a further number to the remaining bits of the shift register as part of the fraction selection signal.

The main divider may be configured to operate using a selected one of a plurality of pairs of dual modulus division ratios, and the method may comprise selecting a said pair of dual modulus division ratios in accordance with a desired total division ratio for the divider circuitry.

The method may comprise selecting the said pair of dual modulus division ratios, the operational length of the shift register and the fraction selection signal in accordance with the desired total division ratio.

According to a seventh aspect, there is provided a computer program which, when loaded into a computer, causes the computer to become the apparatus of any relevant aspect, or to perform the method of any relevant aspect, the program being optionally carried by a carrier medium, wherein the carrier medium may be a recording medium or a transmission medium.

Any circuitry may include one or more processors, memories and bus lines. One or more of the circuitries described may share circuitry elements.

The present invention includes one or more aspects, embodiments or features in isolation or in various combinations whether or not specifically stated (including claimed) in that combination or in isolation.

The above summary is intended to be merely exemplary and non-limiting.

BRIEF DESCRIPTION OF THE DRAWINGS

A description is now given, by way of example only, with reference to the accompanying drawings, in which.

DETAILED DESCRIPTION

A digital control unit and synthesizer architecture will now be described.

Much of the functionality of the synthesizer lies in the digitally synthesized block, which allows the implementation of sophisticated high-speed algorithms for fast locking and phase noise improvement.

Figure 1:
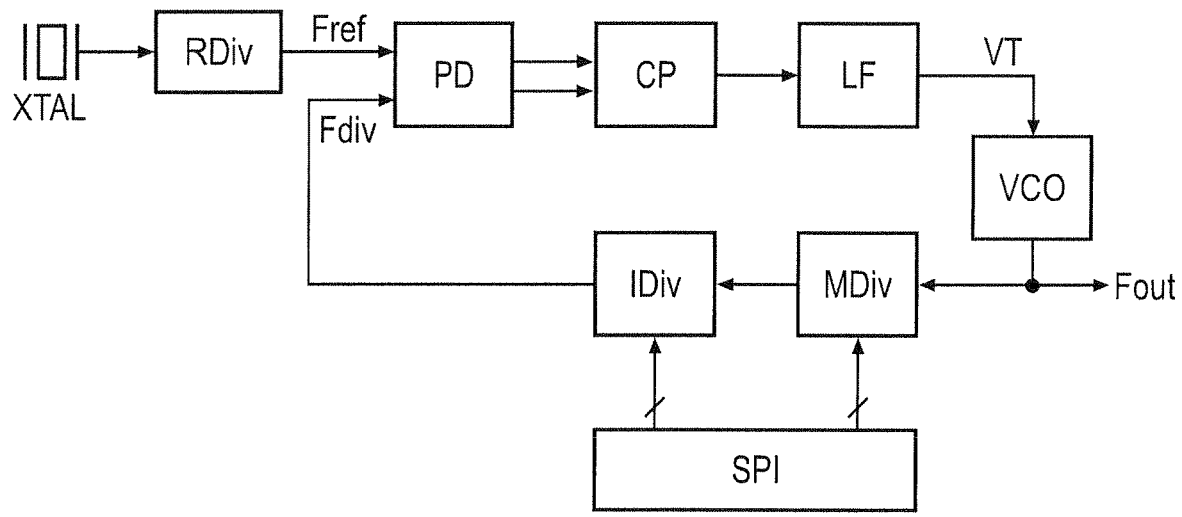
FIG. 1 is a simplified functional block diagram of a PLL synthesizer.

A simplified functional block diagram of the synthesizer architecture is shown in FIG. 1. The synthesizer includes a divider chain main divider (MDiv) plus an integer divider (IDiv), which are both controlled by the serial peripheral interface. A more detailed view of a particular example of the synthesizer architecture with emphasis on the analogue units is shown in FIG. 2.

The MDiv is a dual modulus divider (prescaler), which can be programmed for three sets of dual modulus division ratios. The selected frequency generation scheme is decoded into one of the above three sets of division ratios and rounded out by the matching division ratio of the IDiv (13, 14, 15, or 16). The control within the selected set (n/n+1) is done by a third-order sigma delta pseudorandom generator, where the 7-level output is mapped into the first of seven subsequent n/n+1 cycles, counted by the IDiv.

This architecture uses a small subset of fast division ratios (total of 4), while matching the high dynamic range of the third-order sigma delta (7 levels) and achieving, together with the programmable IDiv, a continuous range of total division ratios from 95 to 154. This is so as to cope with a frequency range from 2.766 to 3.253 GHz including a choice of reference frequencies between 22.4 and 26.0 MHz. Six additional cycles provide for a continuous divider ratio range. This results in a total minimum IDiv ratio of 13.

Figure 2:
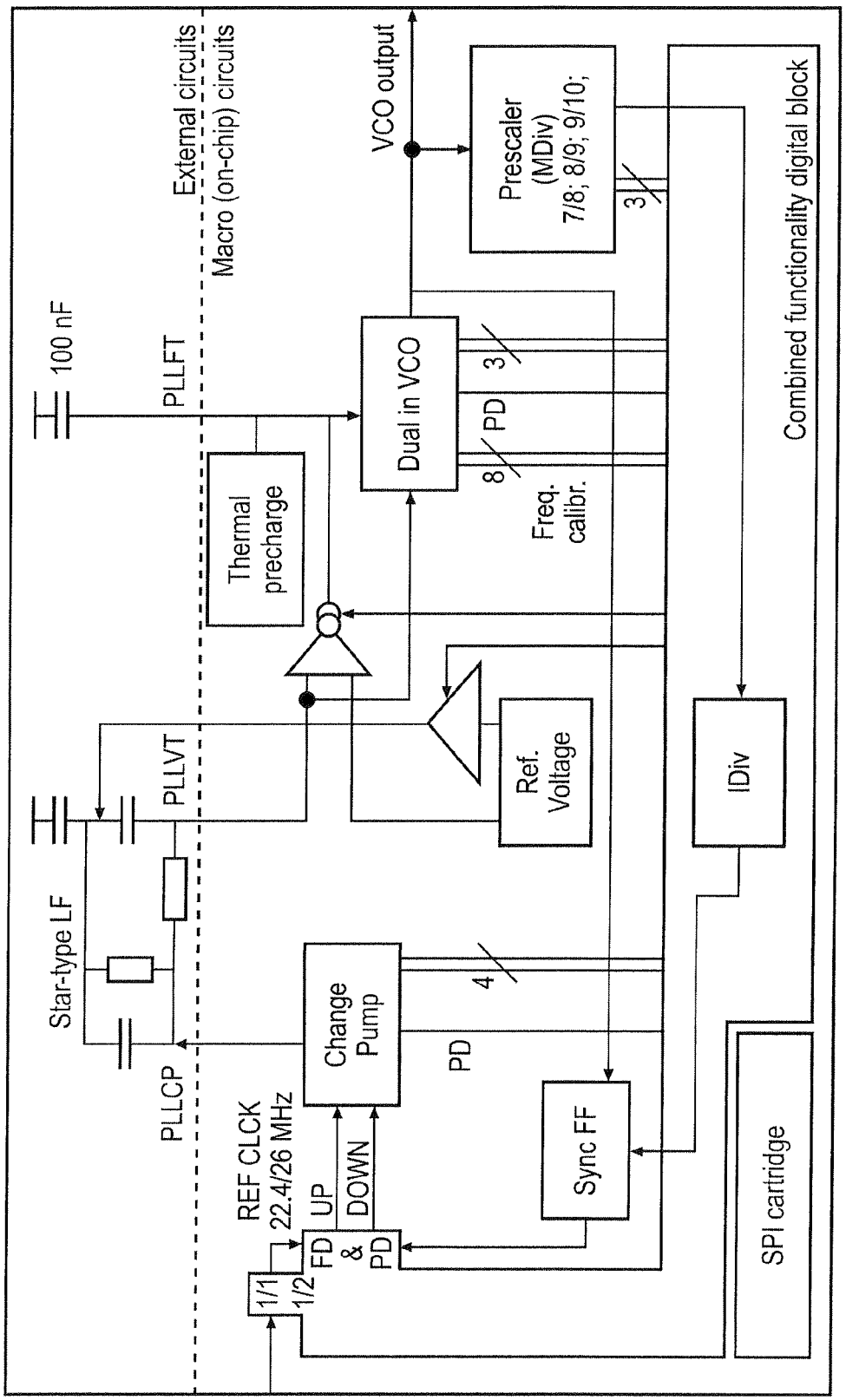
FIG. 2 is a more detailed block diagram of the PLL synthesizer of FIG. 1.

It is to be understood that the values given here are illustrative of the particular example of the frequency synthesizer shown in FIG. 2, and that the invention is not limited to these values.

Figure 8:
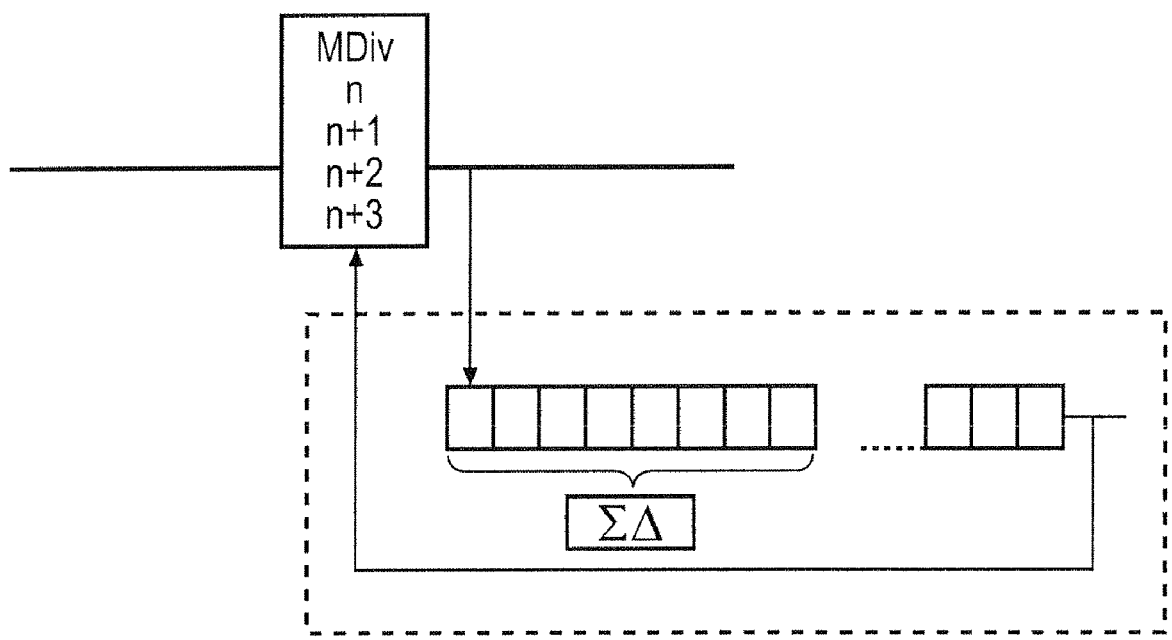
FIG. 8 is a block diagram of one example of divider circuitry.

FIG. 8 is a block diagram showing the divider circuitry in a more general sense. The divider circuitry includes the MDiv, which receives an input signal from a feedback path of the phase-locked loop frequency synthesizer. The main divider divides the input signal by a division ratio selected from a pair of dual modulus division ratios in accordance with a dual modulus selection signal. The main divider comprises a control input for receiving the dual modulus selection signal. The divider circuitry includes the IDiv as part of an auxiliary divider, which comprises a shift register clocked by the output signal of the main divider. The shift register comprises a parallel input, configured to receive parallel input data in the form of a fraction selection signal at the start of a cycle and a serial output connected to the control input of the main divider. The auxiliary divider is configured to produce serial output data, each bit of which serves as a dual modulus selection signal to cause the main divider to operate using one or the other of the pair of dual modulus division ratios. The IDiv is configured to produce a pulse once per cycle and to output the pulse to a phase detector of the phase locked loop frequency synthesizer, and to the shift register as a load signal.

Tables 1 and 2 give examples of the division ratios that can be achieved using the divider circuitry. The division ratios are calculated using the equation given under Tables 1 and 2, where $F_{VCO}$ is the output frequency of the voltage controlled oscillator, $F_{REF}$ is the reference frequency, NM is the lower of the pair of division ratios selected by the MDiv, NI is the division ratio of the IDiv and also the operation length of the shift register, Off is the number of '1's in the extra bits of the shift register (those which are not controlled by the sigma-delta pseudorandom generator but which are part of the operational part of the shift register), 3 is a value to shift the output from the sigma delta pseudorandom generator from the range −3 . . . +4 to the range 0 . . . 7, and $F/2^{24}$ is a fractional value.

Figure 9:
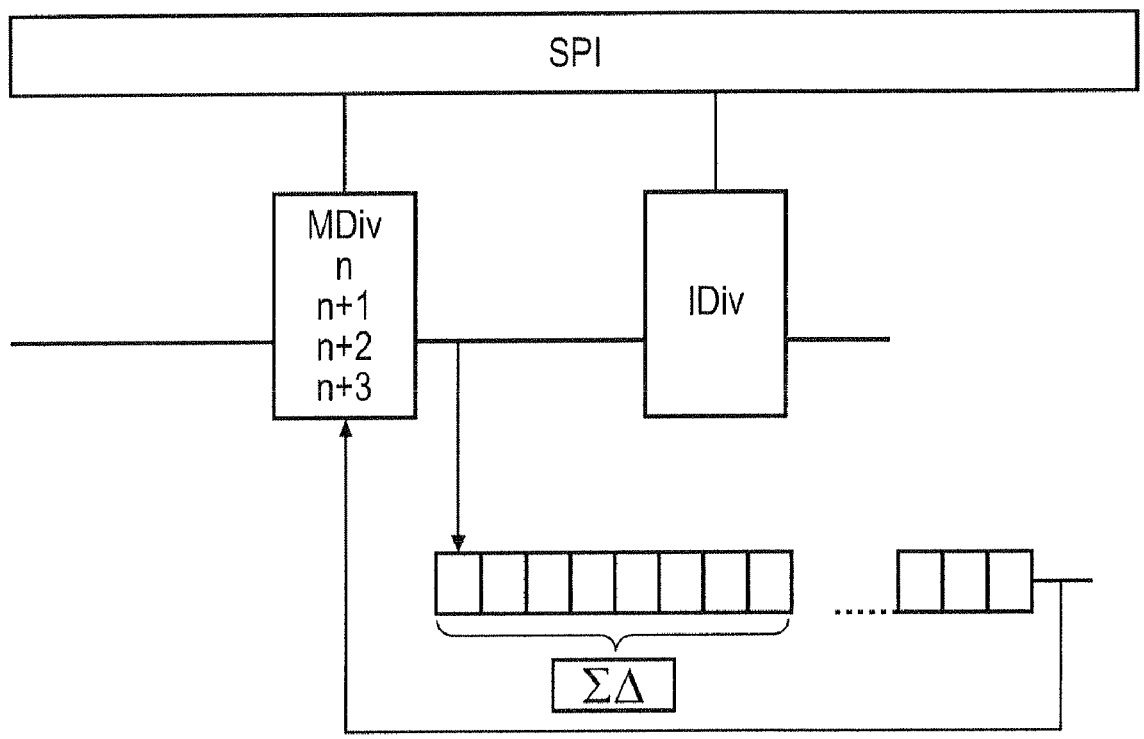
FIG. 9 is a block diagram of another example of divider circuitry.

FIG. 9 is a block diagram illustrating an alternative configuration of the divider circuitry. The IDiv block in FIG. 9 is a programmable divider configured to control the shift register so as to implement variable cycle length.

Figure 6:
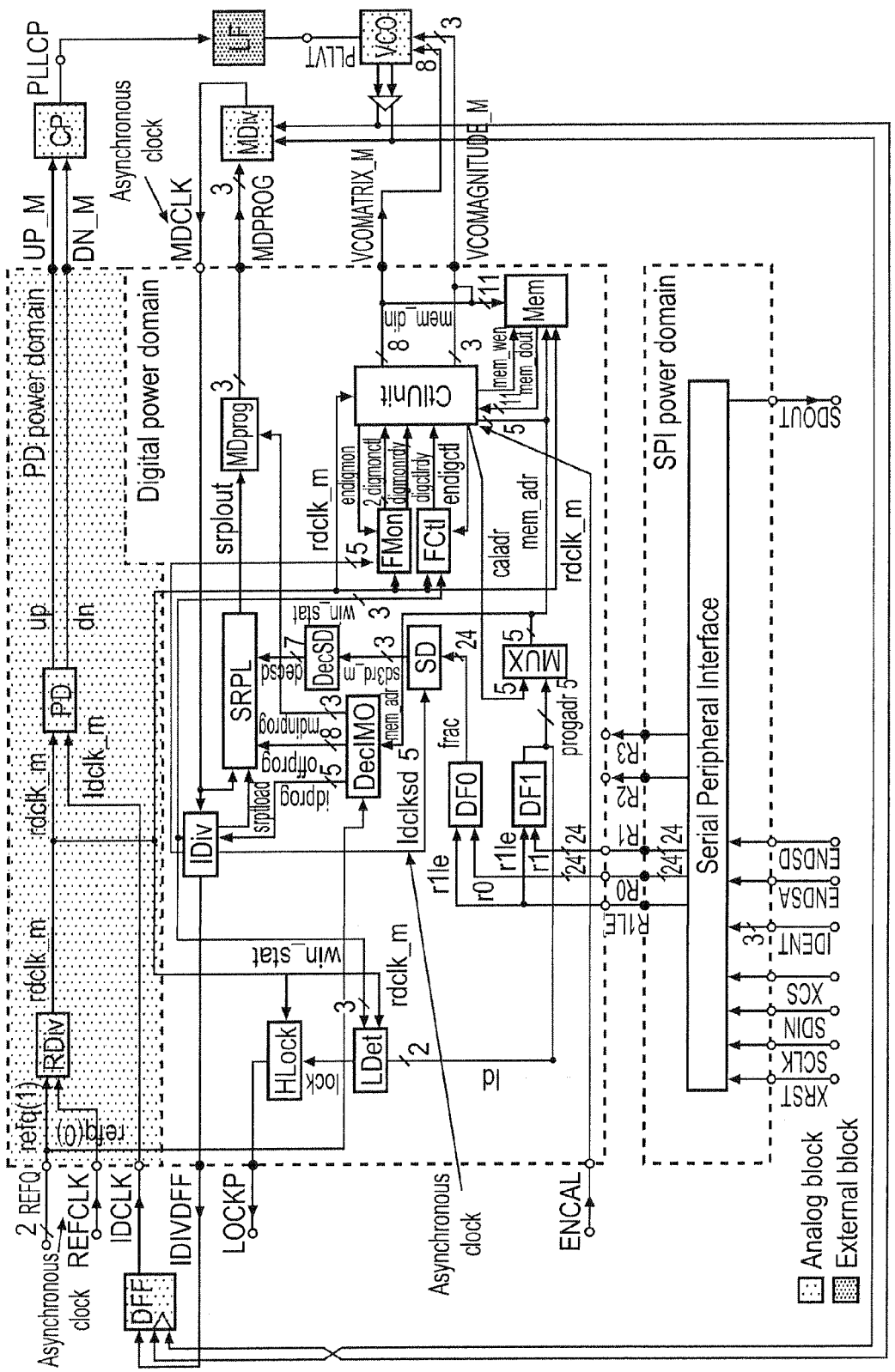
FIG. 6 is a block diagram of a digital control unit, showing connectivity to other blocks.
Figure 7A:
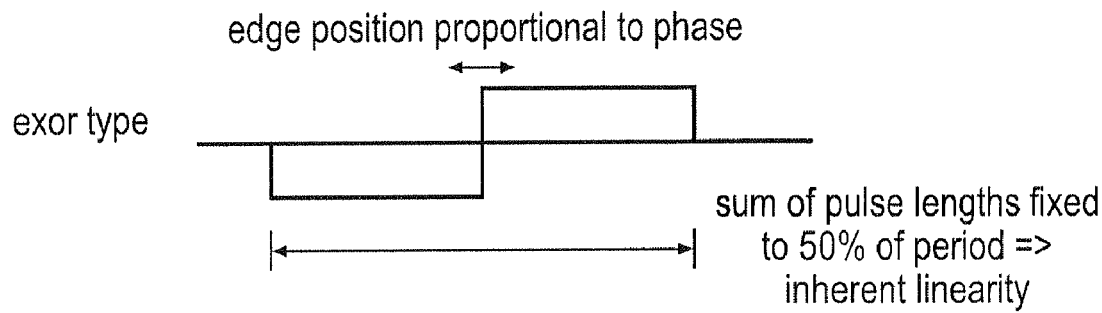
FIG. 7A shows control pulses generated by an exor-type phase detector.
Figure 7B:
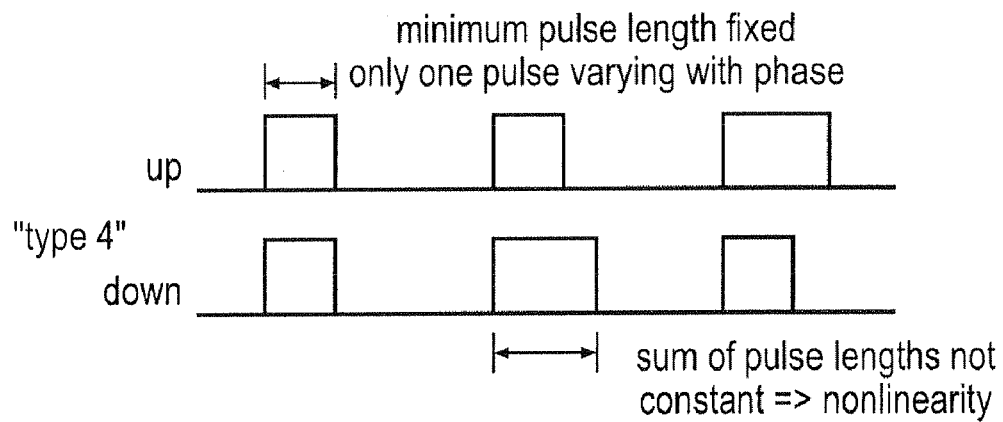
FIG. 7B shows control pulses generated by a "type 4" phase detector.
Figure 7C:
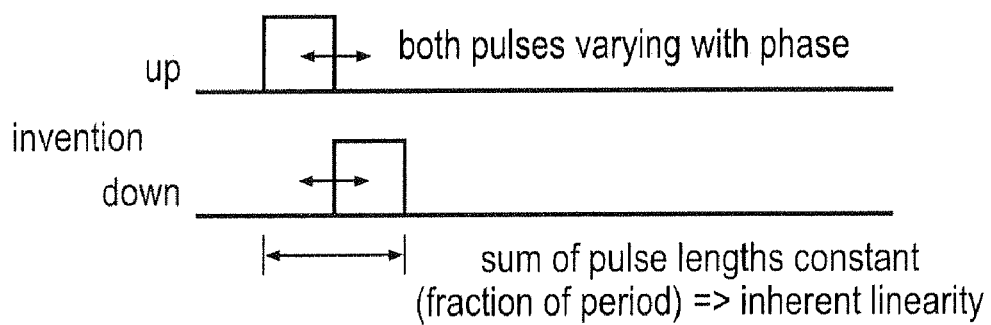
FIG. 7C shows control pulses generated by a further phase detector.

FIG. 6 shows further detail of the divider circuitry, including the main divider MDiv, the integer divider IDiv and the shift register SRPL.

The divider circuitry provides for low noise frequency synthesis, and can be used in all integrated low noise sigma-delta frequency synthesizers. In essence, the divider circuitry provides for a ΣΔ frequency synthesizer using a prescaler with a reduced number of divider ratios and a postscaler with adaptive prescaler control to achieve a continuous frequency range. The divider circuitry uses dual-modulus prescaler operation where multiple timing/counting levels are achieved by summing of multiple subsequent prescaler cycles with the sub-choice of 2 divider modl (n/n+1) for every selected divider ratio, providing for simplified prescaler design and inherent timing linearity and avoiding the higher complexity and inherent worse linearity of other multimodulus prescalers.

The digital control unit may also include state machines for other control functions (e.g., VCO amplitude control, loop filter precharge, and frequency calibration and recalibration).

Digital frequency calibration and recalibration will now be described.

In the case of a digitally controlled VCO, successful frequency locking may involve proper calibration setting of its capacitor matrix. During the sequential calibration flow, the calibration state machine automatically targets 24 fixed integer calibration frequencies for a reference setting of 22.4 MHz or 21 integer frequencies for a 26-MHz reference setting (both covering the specified frequency range). Reference frequencies such as 52 or 44.8 MHz are divided by two to match the PLL reference frequencies of 26 or 22.4 MHz.

Fast and precise frequency acquisition is accomplished by controlling (counting) the pulses on the input of the IDiv, which enables the maximum possible speed (or precision) of the measurement. In the present design, this is at least 13 times faster than the used reference frequency. The proper capacitor matrix settings are estimated in a successive approximation algorithm starting from the highest frequency. The most significant bit (MSB) setting is estimated first and all matrix bits are subsequently set/reset until the synthesizer frequency becomes within ½ of the least significant bit (LSB) of the calibration target (actual LSB frequency resolution varies over the frequency range because of the nonlinear dependence between capacitance and frequency).

Figure 3:
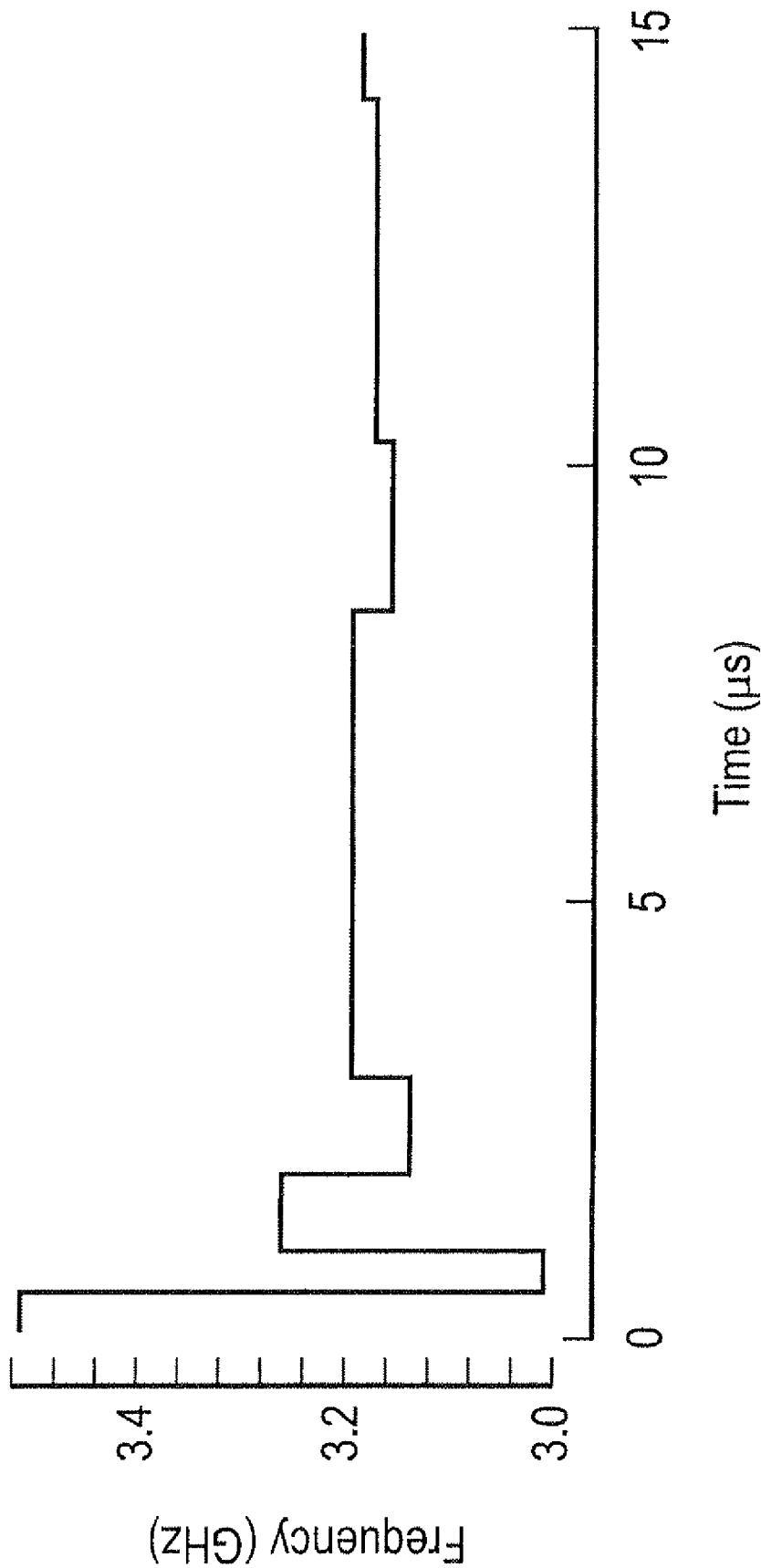
FIG. 3 is a graph of VCO output frequency over time during a frequency calibration sequence.

The modification of the digital control value in the capacitor matrix (as a frequency value over time) is shown in FIG. 3 for a typical (simulated) successive approximation calibration flow for the frequency of 3.1808 GHz.

The calibration sequence ends with the setting of a preprogrammed frequency 2.912 GHz, which is used for further calibration of the front-end.

Figure 4:
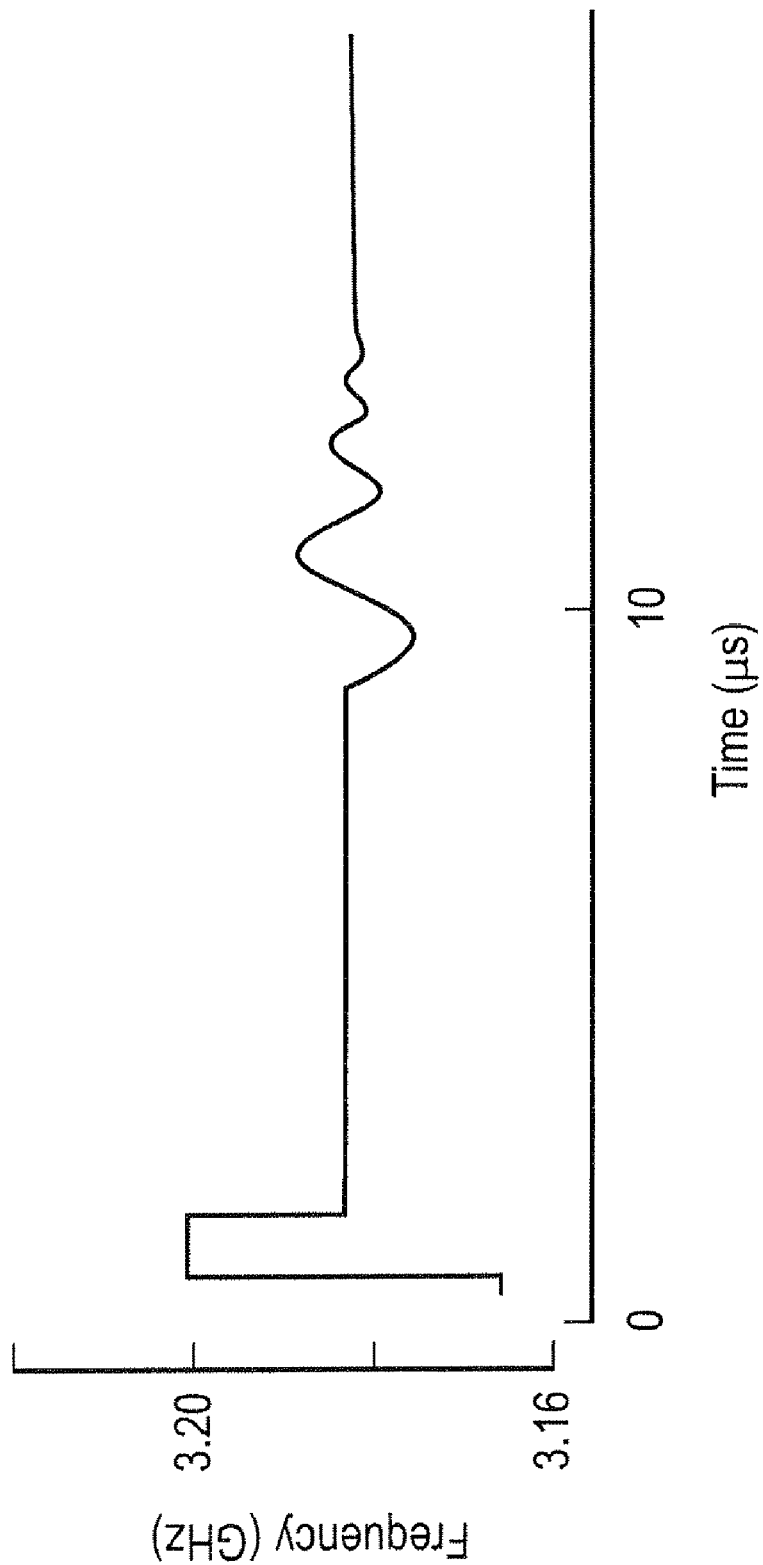
FIG. 4 is a graph of VCO output frequency over time during recalibration (shortened sequence) and final analogue locking.

After the programming of a fractional divider value during frequency hopping, the calibration data might differ by more than 50% of the reference frequency from the final target, mainly because of the fractional value. To avoid locking problems, the initial phase of the lock-up procedure repeats the last four steps of the calibration flow, readjusting the capacitor matrix. To ensure the maximum possible frequency acquisition precision (or minimum jitter) when a fractional divider ratio is used, the ΣΔ generator is forced to the first order during this phase. A further speed increase is achieved by skipping subsequent comparisons after eventually achieving the target locking precision (50% LSB) after any intermediate stage as shown in FIG. 4 (frequency value over time). This phase takes less than 20 μs to set the VCO frequency over the capacitor matrix to within 5 MHz of the target frequency.

Frequency/phase acquisition control will now be described.

During the frequency acquisition phase (first part of the sequence in FIG. 4), the ΣΔ generator is also forced to the first order to enable precise digital frequency comparison. The increased spurious generation with the first-order ΣΔ is not relevant during frequency hopping because the carrier is not used at this time. Furthermore, the digital control unit forces the edge of the output divider pulses to a position very close the target reference clock phase (see also ref. clock edges in FIG. 5), avoiding a phase jump and resulting potential cycle slip and preventing any corresponding increase in the lock-up time.

The phase detector will now be described.

The exclusive-OR (ExOr) phase detector principle, chosen for its linearity (inherently superior to phase frequency detectors) also has a disadvantage: the resulting output pulse duration, which is about 50% of the period for every pulse, causes 100% noise transfer for both output pulses from the current sources of the charge pump to the VCO. Further disadvantages are (i) the resulting high reference leakage power (the spectral power in the VCO output, placed at ± the reference frequency from the carrier), which increases the required loop filter order and (ii) the need for a precise 50% duty cycle preference.

Using some of the additional IDiv-cycles to define a precisely fixed length time-slot (a fixed position fraction of the reference clock cycle) for the charge pump output allows noise and reference leakage power reduction at least as efficiently as can be done with a phase frequency detector while still keeping the superior linearity of the ExOr phase detector. In the example described with reference to FIG. 2, there are six more additional IDiv cycles. In the case of a second-order sigma delta, there may be fewer than six.

Figure 5:
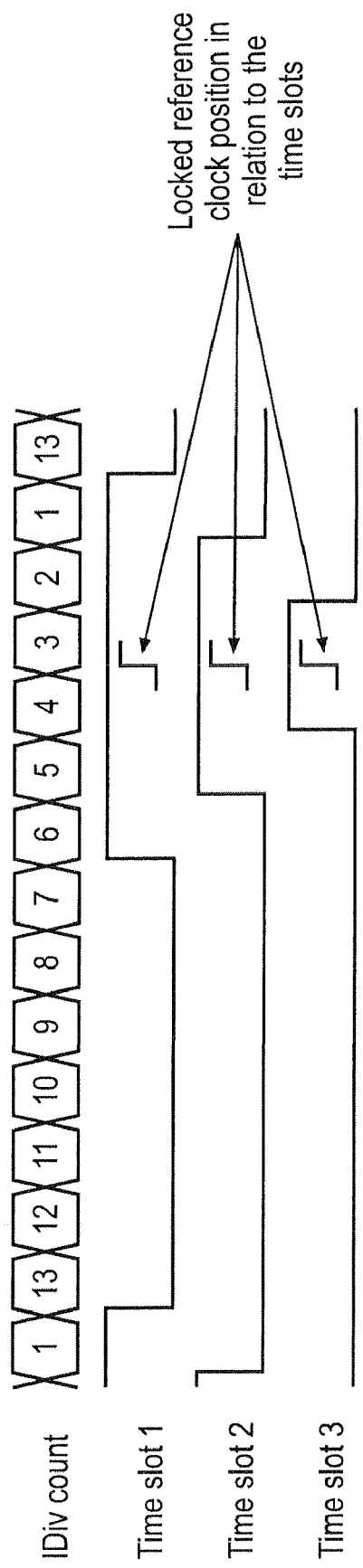
FIG. 5 shows three possible phase detector time slots derived from IDiv setting 13.

Three different possibilities (time slots) for masking the ExOr phase detector input are shown in FIG. 5. They feature fixed lengths of 6, 4, or 2 IDiv pulses within a 13 pulse-cycle (first 7 cycles are controlled by the $\Sigma\Delta$ output which is a random integer between 0 and 7), so they reduce the effective output duty-cycle to 23%, 16%, or 7.7% respectively. The second possibility was chosen with four pulses and a total output pulse duty cycle of 16%. The expected inherent static noise and reference leakage reduction is 3.25 times, or 5.1 dB. Further improvement up to 6.5 times (8.1 dB) should be possible if a very precise and fast charge pump is developed in the future.

It is to be understood that the above values serve as an example only, and do not limit the invention.

In essence, there is provided a phase detector type combining ExOr linearity with short low jitter Up/Down control pulses. The phase detection provides for the simultaneous phase control over both used control paths (Up and Down) over the whole range, and avoids the insufficient linearity for Type 4-detectors, the excessive noise and spurious generation due to the big duty cycle of ExOr-detectors, and the high noise level because of time constants defined by real impedance (e.g. RC) and insufficient linearity improvements in previously-considered detectors (including ExOr detectors and Type-4 detectors).

Figure 10:
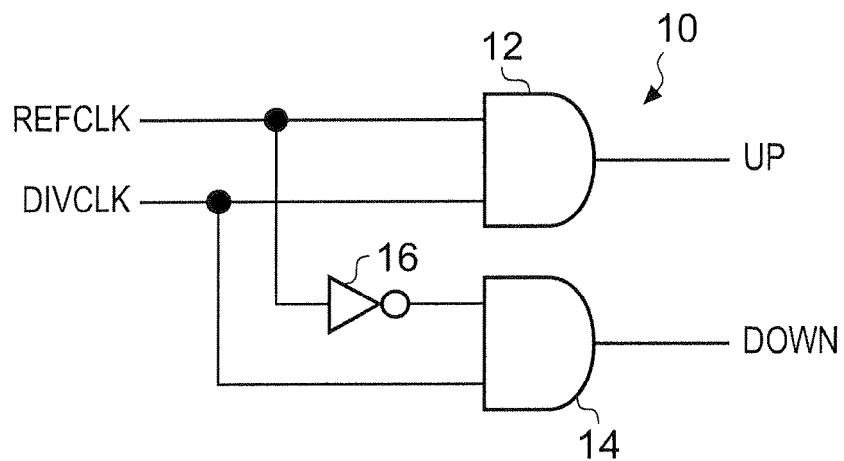
FIG. 10 shows logic circuitry forming part of a phase detector.

FIG. 10 shows logic circuitry 10 forming part of a phase detector PD. The logic circuitry 10 includes a first AND gate 12 which receives a reference signal REFCLK and a divided signal DIVCLK from the divider circuitry (i.e. from the IDiv), and produces an UP pulse as an output signal. As shown, the pulse of the divided signal DIVCLK is shorter than a half period of the divided signal DIVCLK. The logic circuitry 10 further includes a second AND gate 14 which receives the divided signal DIVCLK and an inverted version of the reference signal REFCLK (by way of an inverter 16) and produces a DOWN pulse as an output signal. It will be appreciated that the logic circuitry 10 serves as an example only, and that other circuits may be used to produce the UP and DOWN pulses from the reference signal REFCLK and the divided signal DIVCLK.

Figure 11:
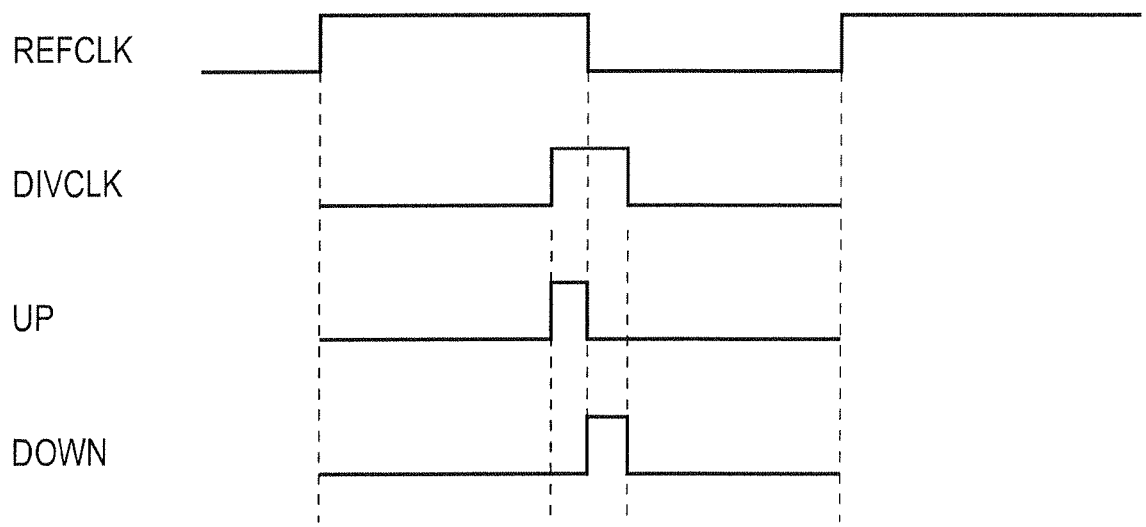
FIG. 11 is a timing diagram including the signals shown in FIG. 10.

FIG. 11 is a timing diagram including the signals input to and output from the logic circuitry 10 of the phase detector PD.

As seen, the pulse of the divided signal DIVCLK is used as a mask against the reference signal REFCLK, to generate the up and down control pulses. In this way, the edges of the control pulses are defined from the edges of the divided signal and the edge of the reference signal. This results in reduced noise owing to the reduced jitter in the control pulses (by virtue of the pulse of the divided signal being derived from the output of the VCO), and the reduced length of the control pulses.

Digital unit implementation will now be described.

Because of the high complexity of the digital control unit (FIG. 6) and synthesis difficulties resulting from the use of two asynchronous clock domains, was actions may be taken to prevent noise coupling. Split supply domains may be used to avoid an increase in jitter in the most critical clock paths. The digital layout may be placed in a triple well region to isolate potential substrate noise from the sensitive area. Due to the high complexity, good testability is useful and test features may be implemented in the synthesizer macro. Several internal signals may be routed to outputs and external signals can be forced to specific internal nodes.

The charge pump will now be described.

The charge pump circuit is often a critical noise contributor in a frequency synthesizer.

The challenge of improving it comes from the two conflicting mechanisms of in-band noise generation:
1) By direct noise generation of the output current sources, where a larger device size is the way to lower noise and
2) Non-linearity due to switching speed limitations, resulting in non-linear $\Sigma\Delta$-value-to-charge dependence. This non-linear dependence folds the wideband sigma delta noise close to the carrier, increasing the in-band phase noise. A smaller device size enables a higher switching speed and results in less noise folding in that case, which conflicts with the first dependency.

While the amount of noise generated in the output current sources can be predicted quite well by simulation (though with considerable effort), a precise estimation of the folding of $\Sigma\Delta$-noise over the charge pump (and phase detector) non-linearity to synthesizer noise is still too complex to be computable by simulation. The only possible approach with the existing development tools is to thoroughly evaluate the first silicon and then improve the balance in a subsequent design phase. A good performance balance is achieved when the difference between the integer and fractional performances approaches 3 dB.

The requirement for 1.2-V supply voltage operation (compared with 3-V for previous synthesizers) further increases the design difficulty because of the unfavourable ratio between the control value (2.4 times lower for a 1.2-V supply compared with a 3-V one) and input noise voltage of the biasing circuit (unchanged). Careful circuit improvement in this area and many iterative simulations may reduce the impact of noise from the output current sources.

The use of 1.2-V devices and a modification of the output current switching for the PMOS current sources (from common source cascade type to transmission gate with a dummy load) was crucial to enable the output duty-cycle reduction.

In summary, the wide-frequency-range synthesizer may be capable of very low phase noise and fast hopping and may be suitable for integration in deep-submicrometer CMOS technology. Any limitations on the analog performance (typical for this kind of technology) have been addressed by choosing optimised circuit topologies and using sophisticated digital control algorithms. The required performance, which is not feasible with a completely analog design approach, may be achieved by increasing the design complexity and using autonomous built-in state machines for continuous tracking and optimization of the analog operating points. This approach is useful in compensating for the huge process variation range, which is a consequence of the reduced structure size in these technologies. Measurement results showed phase noise of −94.8 dBc/sqrHz and a lock up time of 130.8 µs, which are very close to the expected values. Novel techniques were successfully implemented within the synthesizer design, allowing a simplified prescaler and extremely good phase detector linearity. The phase detector concept used in this development has potential for future phase noise improvement.

TABLE 1

| Address | Fref | Factor | NM | NI | Off | Fvco |
|---|---|---|---|---|---|---|
| 0 | 22.4 | 123 | 8 | 15 | 0 | 2755.2 |
| 1 | 22.4 | 124 | 8 | 15 | 1 | 2777.6 |
| 2 | 22.4 | 125 | 8 | 15 | 2 | 2800.0 |
| 3 | 22.4 | 126 | 8 | 15 | 3 | 2822.4 |
| 4 | 22.4 | 127 | 8 | 15 | 4 | 2844.8 |
| 5 | 22.4 | 128 | 8 | 15 | 5 | 2867.2 |
| 6 | 22.4 | 129 | 8 | 15 | 6 | 2889.6 |
| 7 | 22.4 | 130 | 8 | 15 | 7 | 2912.0 |
| 8 | 22.4 | 131 | 8 | 16 | 0 | 2934.4 |
| 9 | 22.4 | 132 | 8 | 16 | 1 | 2956.8 |
| 10 | 22.4 | 133 | 8 | 16 | 2 | 2979.2 |
| 11 | 22.4 | 134 | 8 | 16 | 3 | 3001.6 |
| 12 | 22.4 | 135 | 8 | 16 | 4 | 3024.0 |
| 13 | 22.4 | 136 | 8 | 16 | 5 | 3046.4 |
| 14 | 22.4 | 137 | 8 | 16 | 6 | 3068.8 |
| 15 | 22.4 | 138 | 9 | 15 | 0 | 3091.2 |
| 16 | 22.4 | 139 | 9 | 15 | 1 | 3113.6 |
| 17 | 22.4 | 140 | 9 | 15 | 2 | 3136.0 |
| 18 | 22.4 | 141 | 9 | 15 | 3 | 3158.4 |
| 19 | 22.4 | 142 | 9 | 15 | 4 | 3180.8 |
| 20 | 22.4 | 143 | 9 | 15 | 5 | 3203.2 |
| 21 | 22.4 | 144 | 9 | 15 | 6 | 3225.6 |
| 22 | 22.4 | 145 | 9 | 15 | 7 | 3248.0 |
| 23 | 22.4 | 146 | 9 | 15 | 8 | 3270.4 |
| 24 | 22.4 | 147 | 9 | 16 | 0 | 3292.8 |
| 25 | 22.4 | 148 | 9 | 16 | 1 | 3315.3 |
| 26 | 22.4 | 149 | 9 | 16 | 2 | 3337.6 |
| 27 | 22.4 | 150 | 9 | 16 | 3 | 3360.0 |
| 28 | 22.4 | 151 | 9 | 16 | 4 | 3382.4 |
| 29 | 22.4 | 152 | 9 | 16 | 5 | 3404.8 |
| 30 | 22.4 | 153 | 9 | 16 | 6 | 3427.2 |
| 31 | 22.4 | 154 | 9 | 16 | 7 | 3449.6 |

Fvco = Fref * (NM * NI + Off + 3 + F/2^24)

TABLE 2

| Address | Fref | Factor | NM | NI | Off | Fvco |
|---|---|---|---|---|---|---|
| 0 | 26.0 | 97 | 7 | 13 | 3 | 2522.0 |
| 1 | 26.0 | 98 | 7 | 13 | 4 | 2548.0 |
| 2 | 26.0 | 99 | 7 | 13 | 5 | 2574.0 |
| 3 | 26.0 | 100 | 7 | 13 | 6 | 2600.0 |
| 4 | 26.0 | 101 | 7 | 14 | 0 | 2626.0 |
| 5 | 26.0 | 102 | 7 | 14 | 1 | 2652.0 |
| 6 | 26.0 | 103 | 7 | 14 | 2 | 2678.0 |
| 7 | 26.0 | 104 | 7 | 14 | 3 | 2704.0 |
| 8 | 26.0 | 105 | 7 | 14 | 4 | 2730.0 |
| 9 | 26.0 | 106 | 7 | 14 | 5 | 2756.0 |
| 10 | 26.0 | 107 | 7 | 14 | 6 | 2782.0 |
| 11 | 26.0 | 108 | 7 | 15 | 0 | 2808.0 |
| 12 | 26.0 | 109 | 7 | 15 | 1 | 2834.0 |
| 13 | 26.0 | 110 | 7 | 15 | 2 | 2860.0 |

TABLE 2-continued

| Address | Fref | Factor | NM | NI | Off | Fvco |
|---|---|---|---|---|---|---|
| 14 | 26.0 | 111 | 7 | 15 | 3 | 2888.0 |
| 15 | 26.0 | 112 | 7 | 15 | 4 | 2912.0 |
| 16 | 26.0 | 113 | 7 | 15 | 5 | 2938.0 |
| 17 | 26.0 | 114 | 7 | 15 | 6 | 2964.0 |
| 18 | 26.0 | 115 | 7 | 16 | 0 | 2990.0 |
| 19 | 26.0 | 116 | 7 | 16 | 1 | 3016.0 |
| 20 | 26.0 | 117 | 7 | 16 | 2 | 3042.0 |
| 21 | 26.0 | 118 | 7 | 16 | 3 | 3068.0 |
| 22 | 26.0 | 119 | 7 | 16 | 4 | 3094.0 |
| 23 | 26.0 | 120 | 7 | 16 | 5 | 3120.0 |
| 24 | 26.0 | 121 | 7 | 16 | 6 | 3146.0 |
| 25 | 26.0 | 122 | 7 | 16 | 7 | 3172.0 |
| 26 | 26.0 | 123 | 8 | 15 | 0 | 3198.0 |
| 27 | 26.0 | 124 | 8 | 15 | 1 | 3224.0 |
| 28 | 26.0 | 125 | 8 | 15 | 2 | 3250.0 |
| 29 | 26.0 | 126 | 8 | 15 | 3 | 3276.0 |
| 30 | 26.0 | 127 | 8 | 15 | 4 | 3302.0 |
| 31 | 26.0 | 128 | 8 | 15 | 5 | 3328.0 |

Fvco = Fref * (NM * NI + Off + 3 + F/2^24)

It will be appreciated that the aforementioned circuitry may have other functions in addition to the mentioned functions, and that these functions may be performed by the same circuit. In particular, the phase-locked loop may form part of a circuit other than a frequency synthesizer.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A phase-locked loop frequency synthesizer comprising: phase detector circuitry; and
divider circuitry configured to produce a divided signal, the phase detector circuitry comprising:
a reference input configured to receive a reference signal;
a feedback input configured to receive the divided signal from the divider circuitry in a feedback path of the phase-locked loop; and
pulse generation circuitry configured to generate control pulses for controlling a charge pump in the phase-locked loop in accordance with a frequency and phase relationship between the reference signal and the divided signal; wherein the divided signal comprises a pulse having a length shorter than a half period of the divided signal, and wherein the pulse generation circuitry is configured to generate the control pulses by masking the reference signal using the pulse of the divided signal as a mask, such that the edges of the control pulses correspond to the edges of the divided signal and an edge of the reference signal;
the divider circuitry comprising:
a main divider configured to divide an input signal received from the feedback path of the phase-locked loop by a division ratio selected from a pair of dual modulus division ratios in accordance with a dual modulus selection signal, and to output the divided input signal as an output signal, the main divider comprising a control input for receiving the dual modulus selection signal; and an auxiliary divider comprising a shift register clocked by the output signal on the main divider, the shift register comprising a parallel input configured to receive parallel input data in the form of a fraction selection signal at the start of a cycle, and a serial output connected to the control input of the main divider, the auxiliary divider being configured to produce serial output data, each bit of which serves as a said dual modulus selection signal to cause the main divider to operate using one or the other of the pair of dual modulus main division ratios, wherein the auxiliary divider is configured to produce the divided signal which comprises the pulse once per cycle and to output the pulse to the phase detector circuitry.

2. The phase-locked loop frequency synthesizer of claim 1 wherein the pulse generation circuitry comprises logic circuitry configured to receive the divided signal and the reference signal as inputs and to generate the control pulses as an output.

3. The phase-locked loop frequency synthesizer of claim 2 wherein the logic circuitry comprises a first AND gate configured to receive the reference signal and the divided signal from the divider circuitry and to produce an up pulse as an output signal, and further comprises a second AND gate configured to receive the divided signal and an inverted version of the reference signal and to produce a down pulse as an output signal.

4. The phase-locked loop frequency synthesizer of any one of claims 1 to 3 wherein the pulse generation circuitry is configured to generate control pulses the sum of the lengths of which is smaller than a half period of the divided signal.

5. The phase-locked loop frequency synthesizer of any one of claims 1 to 3 wherein the pulse generation circuitry is configured to split the pulse of the divided signal into an up pulse and a down pulse.

6. The phase-locked loop frequency synthesizer of any one of claims 1 to 3 wherein the pulse generation circuitry is configured to generate control pulses having a control pulse length, defining the sum of the lengths of up and down control pulses, the control pulse length being split by an edge of the reference signal.

7. The phase-locked loop frequency synthesizer of any one of claims 1 to 3 wherein the pulse generation circuitry is configured to generate one of an up pulse and a down pulse from one half of a pulse of the divided signal, and to generate the other of the up pulse and the down pulse from the other half of the pulse of the divided signal.

8. A method of operating a phase detector circuitry for a phase-locked loop frequency synthesizer, the phase-locked loop frequency synthesizer having divider circuitry configured to produce a divided signal, the divider circuitry including a main divider and an auxiliary divider, the method comprising:

receiving a reference signal;

receiving the divided signal from the divider circuitry in a feedback path of the phase-locked loop;

generating control pulses for controlling a charge pump in the phase-locked loop in accordance with a frequency and phase relationship between the reference signal and the divided signal; wherein the divided signal comprises a pulse having a length shorter than a half period of the divided signal, and wherein the method comprises generating the control pulses by masking the reference signal using the pulse of the divided signal as a mask, such that the edges of the control pulses correspond to the edges of the divided signal and an edge of the reference signal;

using the main divider to divide an input signal received from the feedback path of the phase-locked loop by a division ratio selected from a pair of dual modulus division ratios in accordance with a dual modulus selection signal, and to output the divided input signal as an output signal;

using the auxiliary divider, which comprises a shift register clocked by the output signal of the main divider, the shift register comprising a parallel input configured to receive parallel input data in the form of a fraction selection signal at the start of a cycle, and a serial output connected to the control input of the main divider, to produce serial output data, each bit of which serves as said dual modulus selection signal to cause the main divider to operate using one or the other of the pair of dual modulus main division ratios; and using the auxiliary divider to produce the divided signal which comprises the pulse once per cycle and to output the pulse to the phase detector circuitry.

9. The method of claim 8 comprising using logic circuitry to receive the divided signal and the reference signal as inputs and to generate the control pulses as an output.

10. The method of claim 9 comprising using a first AND gate to receive the reference signal and the divided signal from the divider circuitry and to produce an up pulse as an output signal, and further comprising using a second AND gate to receive the divided signal and an inverted version of the reference signal and to produce a down pulse as an output signal.

11. A non-transitory computer readable recording medium storing a computer program which, when loaded into a computer, causes the computer to become the phase-locked loop frequency synthesizer claimed in any of claims 1 to 3, or to perform the method of any of claims 8 to 10.

* * * * *

UNITED STATES PATENT AND TRADEMARK OFFICE
CERTIFICATE OF CORRECTION

PATENT NO. : 7,898,307 B2
APPLICATION NO. : 12/346269
DATED : March 1, 2011
INVENTOR(S) : Walter Marton et al.

Page 1 of 1

It is certified that error appears in the above-identified patent and that said Letters Patent is hereby corrected as shown below:

Title Page:

Item (73)     Assignee: should read as follows:

-- (73)     Assignee: Fujitsu Semiconductor Limited, Yokohama, (JP) --

Signed and Sealed this
Twenty-sixth Day of April, 2011

David J. Kappos
*Director of the United States Patent and Trademark Office*